(12) United States Patent
Fehrer et al.

(10) Patent No.: US 7,994,519 B2
(45) Date of Patent: Aug. 9, 2011

(54) SEMICONDUCTOR CHIP AND METHOD FOR PRODUCING A SEMICONDUCTOR CHIP

(75) Inventors: Michael Fehrer, Bad Abbach (DE); Uwe Strauss, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 461 days.

(21) Appl. No.: 12/218,492

(22) Filed: Jul. 14, 2008

(65) Prior Publication Data

US 2009/0045426 A1  Feb. 19, 2009

(30) Foreign Application Priority Data

Jul. 12, 2007  (DE) .................. 10 2007 032 555

(51) Int. Cl.
*H01L 27/15* (2006.01)
(52) U.S. Cl. .................. 257/86; 257/E25.032
(58) Field of Classification Search .................. 257/79, 257/86, 104, 82, E25.032, E33.056; 438/30
See application file for complete search history.

(56) References Cited

U.S. PATENT DOCUMENTS

| 6,078,064 A | 6/2000 | Ming-Jiunn et al. | |
| 6,515,308 B1 * | 2/2003 | Kneissl et al. | 257/86 |
| 2005/0087753 A1 | 4/2005 | D'Evelyn et al. | |
| 2007/0181894 A1 | 8/2007 | Stein et al. | |

FOREIGN PATENT DOCUMENTS

| DE | 103 46 605 A1 | 3/2005 |
| DE | 10 20025 008 056 A1 | 7/2006 |
| DE | 10 2005 061 797 A1 | 7/2007 |
| EP | 1 577 959 A2 | 9/2005 |
| WO | WO 2007/076743 A1 | 7/2007 |

OTHER PUBLICATIONS

Schnitzer et al., "303% external quantum efficiecy from surface textured, thin-film light-emitting diodes", Applied Physics Letters No. 16, Oct. 18, 1993, pp. 2174-2176.

* cited by examiner

*Primary Examiner* — Quoc D Hoang
(74) *Attorney, Agent, or Firm* — Cohen Pontani Lieberman & Pavane LLP

(57) ABSTRACT

A semiconductor chip (1) comprises a semiconductor body (2) having a semiconductor layer sequence having an active region (23) provided for generating radiation. A contact (4) is arranged on the semiconductor body (2). An injection barrier (5) is formed between the contact (4) and the active region (23). A method for producing a semiconductor chip is also disclosed.

33 Claims, 8 Drawing Sheets

SEMICONDUCTOR CHIP AND METHOD FOR PRODUCING A SEMICONDUCTOR CHIP

RELATED APPLICATIONS

This patent application claims the priority of German patent application 10 2007 032 555.1 filed Jul. 12, 2007, the disclosure content of which is hereby incorporated by reference.

FIELD OF THE INVENTION

The invention relates to a semiconductor chip and to a method for producing a semiconductor chip.

BACKGROUND OF THE INVENTION

In an LED semiconductor chip, the coupling-out efficiency, that is to say the ratio of radiation power emerging from the semiconductor to the radiation power generated in the semiconductor chip, is influenced by numerous loss processes. Absorption losses, in particular, can be the cause of a reduction of the coupling-out efficiency.

SUMMARY OF THE INVENTION

It is an object of the present invention to provide a semiconductor chip having an improved coupling-out efficiency. Another object is to provide a method for the simplified production of a semiconductor chip with a high coupling-out efficiency.

In accordance with one aspect of the invention, a semiconductor chip comprises a semiconductor body having a semiconductor layer sequence that includes an active region provided for generating radiation. A contact is arranged on the semiconductor body. An injection barrier is formed between the contact and the active region.

During operation of the semiconductor chip, the vertical injection of charge carriers from the contact into the active region is reduced by means of the injection barrier. In a plan view of the semiconductor chip, charge carriers are injected into the active region predominantly alongside the contact. For this purpose, the contact expediently has a smaller lateral extent than the active region. Below the contact, by contrast, the injection of charge carriers into the active region is reduced. In this way, it is possible to reduce the probability of radiation being generated below the contact in the active region and subsequently being absorbed by the contact. In other words, radiation is generated in the active region of the semiconductor chip predominantly in lateral regions in which radiation emitted in a vertical direction is not absorbed by an overlying contact, but rather can emerge from the semiconductor chip. The coupling-out efficiency of the semiconductor chip can thus be increased.

In one preferred configuration, the lateral shaping of the injection barrier is adapted to a lateral shaping of the contact. In a plan view of the semiconductor chip, therefore, the injection barrier can overlap with the contact, preferably completely. Furthermore, in plan view the injection barrier preferably has the same basic geometric form as the contact.

In this case, a lateral direction is understood to be a direction which extends along a main extension direction of the semiconductor layers of the semiconductor layer sequence. Correspondingly, a vertical direction runs perpendicular to the main extension direction of said semiconductor layers.

In one configuration variant, the injection barrier is formed at an interface between the contact and the semiconductor body. In this case, the injection barrier can be represented by means of a potential barrier, in particular by means of a Schottky contact, that is to say a metal-semiconductor junction, between the contact and the semiconductor body.

Furthermore, the injection barrier can be formed in a recess in the semiconductor body. By way of example, material of the semiconductor body which has a comparatively low contact resistance with respect to the contact can be removed by means of the recess. As a result, material of the semiconductor body can be uncovered which has a higher contact resistance with respect to the contact. In this way, the contact arranged in the recess can have a higher contact resistance with respect to the semiconductor body in a vertical direction than in a lateral direction. A direct vertical injection of charge carriers from the contact into the active region is reduced in this way.

It should be noted at this point that a contact resistance which cannot be completely avoided owing to the dictates of production, in particular an ohmic contact resistance having a linear or at least approximately linear current-voltage characteristic curve, between a metal contact and a semiconductor layer is not regarded as an injection barrier within the meaning of the present invention. Rather, the injection barrier is preferably formed in such a way that charge carriers impressed into the contact by means of an external electrical voltage during operation of the semiconductor chip, in a plan view of the semiconductor chip in the region of the injection barrier, are not injected or are injected into the active region at least with a very much lower probability than outside the injection barrier. In this case, the injection barrier has a smaller lateral extent than the active region.

In an alternative configuration variant, the injection barrier is formed in the semiconductor body. Preferably, the injection barrier is formed by means of a region in which an electrical conductivity of a semiconductor layer arranged between the active region and the contact is locally reduced. The conductivity of the semiconductor layer is therefore lower in this region than outside this region. In other words, the conductivity is reduced in this region compared with a laterally adjacent region of the semiconductor layer. Furthermore, this region of lower conductivity, in a lateral direction, is preferably formed in insular fashion and its lateral shaping is particularly preferably adapted to the lateral shaping of the contact.

The region in which the conductivity is reduced can be spaced apart from the contact in a vertical direction. In this case, during operation of the semiconductor chip, charge carriers can be injected directly in a vertical direction from the contact into the semiconductor body. A further-reaching direct vertical injection into the active region is prevented on account of this region of low electrical conductivity, or at least reduced in favor of an increased injection outside this region. The coupling-out efficiency of the semiconductor body can thus be increased.

In a further alternative configuration variant, the injection barrier is formed outside the semiconductor body. Preferably, the injection barrier is formed by means of an insulation layer arranged between the semiconductor body and the contact. Furthermore, a plurality of insulation layers can be formed between the semiconductor body and the contact. Particularly preferably, the plurality of insulation layers is formed in accordance with a Bragg mirror. A dielectric mirror can therefore be formed by means of the insulation layer.

The injection barrier can, therefore, additionally fulfill the function of a mirror for radiation generated in the active region. Absorption of said radiation in the contact can thus be greatly reduced. The radiation reflected at the injection barrier, in particular at the dielectric mirror, can subsequently emerge from the semiconductor chip. The coupling-out efficiency of the semiconductor chip can therefore be increased more extensively.

In one preferred configuration, the contact has a contact layer, which terminates the contact on the side remote from the semiconductor body. The contact layer serves, in particular, for making external contact with the semiconductor chip, for example by means of a bonding wire. The contact layer preferably contains a metal, for instance Au, Ti, Pt or Ni, or a metallic alloy comprising at least one of said materials.

The contact furthermore preferably has a mirror layer arranged between the contact layer and the semiconductor body. The mirror layer preferably has a high reflectivity for radiation generated in the active region. The mirror layer preferably contains a metal, for instance gold, aluminum, silver, palladium or rhodium, or a metallic alloy containing at least one of the metals mentioned. Absorption of radiation generated in the active region in the contact layer can be avoided by means of the mirror layer. The coupling-out efficiency of the semiconductor chip can thereby be increased.

The contact layer can project beyond the mirror layer at least in regions in a lateral direction. In particular, the contact layer can mold over the mirror layer in a lateral direction, that is to say that the contact layer covers the mirror layer also at least one side area. A direct injection of charge carriers from the contact layer into a layer adjoining the contact layer in a lateral direction can be simplified in this way. In this case, the mirror layer makes no or at least no significant contribution to the injection of charge carriers from the contact into the semiconductor body.

Furthermore, the mirror layer can be arranged on that side of the insulation layer or of the plurality of insulation layers which is remote from the active region. Radiation transmitted by the insulation layers can be reflected at the mirror layer in this way. A mirror assemblage having a high total reflectivity for radiation generated in the active region can be formed in a simplified manner in this way.

In one preferred configuration, the semiconductor chip has a current spreading layer, which is electrically conductively connected to the contact. During operation of the semiconductor chip the current spreading layer is provided for injecting charge carriers into the active region outside the injection barrier in a plan view of the semiconductor chip.

The current spreading layer preferably has a large lateral extent in comparison with the contact. The current spreading layer particularly preferably adjoins a side area of the semiconductor body which delimits the active region in a lateral direction. Large-area impression of charge carriers into the active region is thereby simplified.

In one preferred configuration, the current spreading layer has a recess, in which the contact is arranged. The recess can also extend in a vertical direction through the current spreading layer. A vertical injection of charge carriers from the contact into the current spreading layer can thus be reduced.

In this case, the current spreading layer and the contact can adjoin one another in a lateral direction at least in regions. Charge carriers can thus be injected in a lateral direction directly from the contact into the current spreading layer.

As an alternative, the current spreading layer and the contact can be spaced apart from one another laterally. In this case, the current spreading layer and the contact are preferably electrically conductively connected by means of a layer arranged between the contact and the active region.

In a further preferred configuration, the current spreading layer is nonmetallic. Furthermore, the current spreading layer is preferably formed by means of a material which is transmissive to the radiation generated in the active region.

In the context of the invention, a nonmetallic current spreading layer is understood to be a layer or layer sequence wherein although the layer or, respectively, the individual layers of the layer sequence can contain a metal, said layer or layers do not have metallic properties.

In particular, the nonmetallic current spreading layer can be based on a semiconductor material or consist of semiconductor material. The current spreading layer can therefore be formed in the semiconductor body. In this case, the current spreading layer is preferably a semiconductor layer, which is different with regard to its conduction type than a further semiconductor layer arranged between the semiconductor layer and the active region.

As an alternative, the current spreading layer can be arranged outside the semiconductor body. Preferably, a current spreading layer arranged outside the semiconductor body contains a TCO material (transparent conductive oxide).

TCO materials are transparent conductive oxides, generally metal oxides, such as, for example, zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, the group of TCOs also includes ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, the TCOs do not necessarily correspond to a stoichiometric composition and can also be p- or n-doped.

In a further preferred configuration, a connection layer is arranged between the current spreading layer and the semiconductor body. The connection layer expediently contains a material which can be used to produce an electrically conductive connection to a semiconductor layer with a low contact resistance. Preferably, the connection layer contains a metal, for instance titanium, platinum, nickel, rhodium, or a metallic alloy comprising at least one of the materials mentioned. The connection layer is furthermore preferably made sufficiently thin such that it is at least partly transparent to radiation generated in the active region. Particularly preferably, the thickness of the connection layer is at most 10 nm.

In a further preferred configuration, a tunnel contact layer is arranged between the current spreading layer and the active region. The tunnel contact layer is different with regard to its conduction type than a further semiconductor layer arranged between the tunnel contact layer and the active region. The tunnel contact layer is preferably a highly doped semiconductor layer. The doping concentration is preferably at least $10^{18}$ $cm^{-3}$, particularly preferably at least $10^{19}$ $cm^{-3}$.

The injection of charge carriers from the current spreading layer into the active region can be simplified by means of the tunnel contact layer.

In one preferred development, a further tunnel contact layer is arranged on that side of the tunnel contact layer which faces the active region. The further tunnel contact layer has a different conductive type than the tunnel contact layer. Furthermore, the further tunnel contact layer preferably likewise has a high doping concentration.

In a further preferred development, the injection barrier is formed by means of a region of the further tunnel contact layer in which the electrical conductivity is locally reduced. In this case, the injection barrier is therefore formed in the semiconductor body. Furthermore, the tunnel contact layer can be formed between the contact and the further tunnel contact layer. The region of locally reduced conductivity can therefore be spaced apart from the contact in a vertical direction. During operation of the semiconductor chip, charge carriers can thus pass from the contact into the tunnel contact layer and propagate in a lateral direction. The propagation of the charge carriers in a lateral direction can furthermore be fostered by means of the current spreading layer arranged within or outside the semiconductor body. From the tunnel contact layer, the charge carriers can subsequently be injected outside the region of locally reduced electrical conductivity via the further tunnel contact layer into the active region.

The tunnel contact layer and/or the further tunnel contact layer can be made comparatively thin. The thickness can be 100 nm or less, preferably 20 nm or less, particularly preferably 10 nm or less.

In one preferred configuration, the current spreading layer is embodied as a tunnel contact layer. The current spreading layer is therefore a highly doped semiconductor layer and thus part of the semiconductor body. Further layers, arranged outside the semiconductor body, for current spreading and for impressing charge carriers into the active region uniformly in a lateral direction can be dispensed with in this case.

A further tunnel contact layer can in turn be arranged on that side of the tunnel contact layer which faces the active region, wherein the further tunnel contact layer has a different conduction type than the tunnel contact layer.

The semiconductor chip is preferably provided for generating incoherent or predominantly incoherent radiation. By way of example, the semiconductor chip can be embodied as an LED chip or furthermore as an RCLED chip (resonant cavity light emitting diode). In the case of an RCLED chip, the active region is arranged within a cavity.

The semiconductor chip can also be provided for generating coherent radiation. In this case, the semiconductor chip can be embodied as a semiconductor laser chip, in particular as a surface emitting semiconductor laser chip with an internal resonator (vertical cavity surface emitting laser, VCSEL) or as a surface emitting semiconductor chip for operation with an external resonator (vertical external cavity surface emitting laser, VECSEL).

The semiconductor body, in particular the active region, preferably contains a III-V semiconductor material. It is possible to generate radiation from the infrared to the ultraviolet spectral range with high efficiency by means of III-V semiconductor materials.

The semiconductor chip, in particular the semiconductor body, can also have more than one active region, for instance two or more active regions arranged one above another. In this case, the arrangement of the abovementioned elements of the semiconductor chip, in particular of the current spreading layer, of the tunnel contact layer, of the further tunnel contact layer and of the connection layer, relative to the active region relates to that active region which is arranged closest to the contact.

In accordance with one embodiment, in a method according to the invention for producing a semiconductor chip, comprising a semiconductor body having a semiconductor layer sequence having an active region provided for generating radiation, a contact is applied on the semiconductor body. An injection barrier is formed between the active region and the contact.

In one preferred configuration, the injection barrier is formed in the semiconductor body. This is done in particular before the contact is applied on the semiconductor body. Preferably, the injection barrier is formed in the semiconductor body by means of a region of a semiconductor layer in which an electrical conductivity of the semiconductor layer is locally reduced.

This local reduction of the electrical conductivity of the semiconductor layer can be effected for example by compensation of the doping, for instance by targeted disturbance of the crystal structure. By way of example, crystal defects produced in a targeted manner in an originally p-doped semiconductor layer can lead to complete or at least partial compensation of the p-type doping. In this case, the electrical conductivity caused by the acceptors of the p-conducting semiconductor layer is reduced by the imperfections acting as a donor. This can be achieved by means of a backsputtering, for example. During backsputtering, preferably an ion beam, for instance an Ar ion beam, is directed onto the semiconductor layer.

The local reduction of the electrical conductivity can also be achieved by at least partial deactivation of the donors or acceptors. Thus, hydrogen can be introduced into the p-type conducting semiconductor layer for instance by means of a hydrogen plasma. Acceptors, for instance Mg acceptors in an InGaAlN-based semiconductor layer doped in p-conducting fashion, can thus be electrically deactivated.

The electrical conductivity can also be reduced by implantation of ions having an opposite charge type with respect to the semiconductor layer.

In a further preferred configuration, a current spreading layer is applied to the semiconductor body, for instance by means of sputtering or vapor deposition. A laterally patterned masking layer can be formed or arranged on the current spreading layer. Afterward, material of the current spreading layer and of the semiconductor body can be removed in a region free of the masking layer. The lateral patterning of the current spreading layer and of the semiconductor body can therefore be effected by means of a common masking layer. An additional masking layer can therefore be dispensed with. As a result, production costs can be reduced. Furthermore, the patterning accuracy can thereby be increased.

In one preferred development, a further laterally patterned masking layer is formed on the current spreading layer. This is preferably done after the removal of the masking layer.

A recess can be formed in the current spreading layer in a further region free of the further masking layer. A mirror layer and subsequently a contact layer can be applied in the recess.

The deposition conditions during the production of the mirror layer and the contact layer can be set in such a way that the contact layer projects beyond the mirror layer in a lateral direction. By way of example, the mirror layer can be deposited from a perpendicular or substantially perpendicular direction on the semiconductor body, while the contact layer is deposited obliquely upon simultaneous rotation of the semiconductor body. What can thereby be achieved is that the contact layer has a larger lateral extent than the mirror layer without different masking layers being required for this purpose.

Furthermore, the contact or at least one layer of the contact, for instance the contact layer or the mirror layer, can be formed in the recess of the current spreading layer in such a way that the contact is spaced apart from the current spreading layer in a lateral direction. This can be effected by means of the same further masking layer. By way of example, the recess can be formed in the current spreading layer by means of wet-chemical etching. The recess in the current spreading layer can thus assume a larger lateral extent than the cutout in the further masking layer. The contact or at least one layer of the contact can subsequently be deposited in such a way that the lateral extent of the contact or of the at least one layer of the contact is less than or equal to the lateral extent of the cutout in the further masking layer. This can be done by deposition from a perpendicular or substantially perpendicular direction. Thus, it is possible to form at least one interspace between the contact or the at least one layer of the contact.

The production of the layers arranged on the semiconductor body, in particular of the current spreading layer, of the contact layer, of the mirror layer and of the connection layer, is preferably effected by means of vapor deposition or sputtering.

The method described is particularly suitable for producing a semiconductor chip described further above. Features explained in connection with the semiconductor chip can therefore also be used for the method, and vice versa.

BRIEF DESCRIPTION OF THE DRAWINGS

Exemplary embodiments of the invention are disclosed in conjunction with the following figures.

DETAILED DESCRIPTION OF THE DRAWINGS

Elements that are identical, of identical type and act identically are provided with identical reference symbols in the figures.

The figures are in each case schematic illustrations and therefore not necessarily true to scale. Rather, comparatively small elements, in particular thin layers, may be illustrated with an exaggerated size for clarification purposes.

Figure 1:
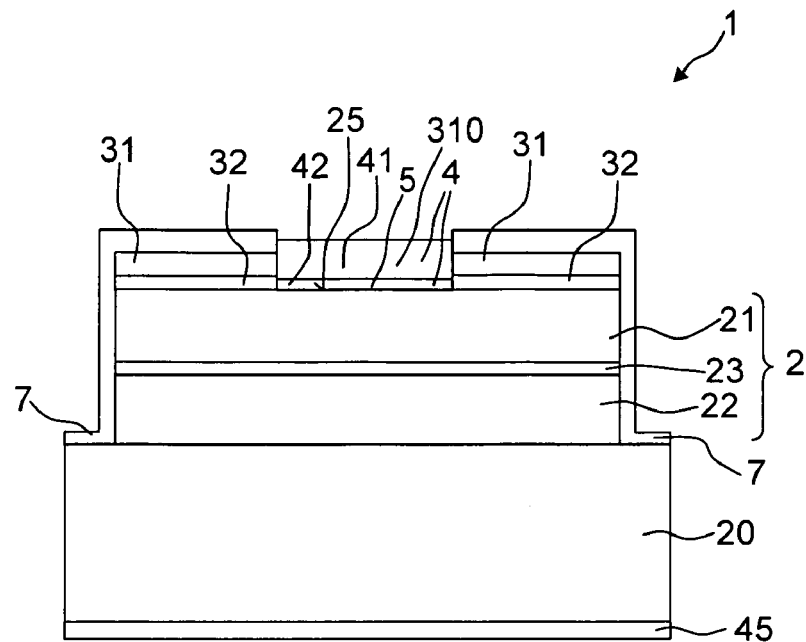
FIG. 1 shows a first exemplary embodiment of a semiconductor chip according to the invention in schematic sectional view.

A first exemplary embodiment of a semiconductor chip according to the invention is illustrated schematically in sectional view in FIG. 1. The semiconductor chip 1 has a semiconductor body 2 having a semiconductor layer sequence. The semiconductor layer sequence forms the semiconductor body. The semiconductor body has an active region 23 arranged between a p-conducting semiconductor layer 21 and an n-conducting semiconductor layer 22.

The semiconductor body 2 is arranged on a carrier 20. The carrier 20 can be for example a growth substrate for the semiconductor layer sequence of the semiconductor body 2. By way of example, the carrier can contain a semiconductor, for instance Si, Ge, GaAs, SiC, GaN or GaP, or consist of such a material. As an alternative, a carrier which contains sapphire or consists of sapphire can, for example, also find application. The carrier can be suitably doped in order to increase the electrical conductivity. The semiconductor layer sequence of the semiconductor body 2 is preferably deposited epitaxially, for instance by means of MBE (Molecular Beam Epitaxy) or MOVPE (Metal Organic Chemical Vapor Phase), on the growth substrate.

A contact 4 is arranged on the semiconductor body 2. The contact is arranged on the opposite side of the active region 23 to the carrier 20 and can have, for example, a circular or rectangular basic form. The contact 4 has a contact layer 41 and a mirror layer 42. The mirror layer is arranged between the contact layer and the semiconductor body 2. An injection barrier 5 is formed between the contact 4 and the semiconductor body 2.

The injection barrier is formed at an interface 25 of the semiconductor body 2 which delimits the semiconductor body in a vertical direction on the side remote from the carrier 20. The injection barrier is embodied as a Schottky contact between the contact 4 and the semiconductor body 2, in particular as a Schottky contact between the mirror layer 42 and the p-conducting semiconductor layer 21. In this case, the lateral extent of the injection barrier 5 is at least as large as the lateral extent of the contact 4.

Furthermore, a current spreading layer 31 is arranged on the semiconductor body 2. The current spreading layer 31 is arranged on the same side of the semiconductor body 2 as the contact 4. In this case, the lateral extent of the current spreading layer is large in comparison with that of the contact 4. The current spreading layer 31 has a recess 310. The cutout preferably extends in a vertical direction through the current spreading layer 31. The contact 4, in particular the contact layer 41, is arranged in said recess.

The contact 4 and the current spreading layer 31, in particular the contact layer 41 and the current spreading layer 31, adjoin one another in a lateral direction. Charge carriers injected into the contact layer 41 during operation of the semiconductor chip can therefore pass in a lateral direction directly from the contact layer into the current spreading layer 31. From the current spreading layer 31, the charge carriers can be injected in a vertical direction into the semiconductor body, in particular into the active region 23. By contrast, a direct vertical injection from the contact layer 41 into the semiconductor body 2 is made more difficult by means of the injection barrier 5. In plan view of the semiconductor chip 1, therefore, radiation is generated in the active region predominantly outside the injection barrier 5. The coupling-out efficiency of the semiconductor chip 1 can thereby be increased (as explained below).

The current spreading layer 31 is preferably embodied in nonmetallic fashion and is furthermore preferably formed such that it is transmissive to radiation generated in the active region. The current spreading layer 31 preferably contains a TCO material, for example indium tin oxide (ITO) or zinc oxide (ZnO). A TCO material mentioned further above can also be suitable for the current spreading layer 31.

A connection layer 32 is formed between the current spreading layer 31 and the semiconductor body 2. By means of the connection layer 32, charge carriers can be injected from the current spreading layer 31 into the semiconductor body 2 in a simplified manner. On account of the connection layer, materials with which a low, in particular ohmic, contact resistance with respect to the semiconductor body 2 cannot be realized or can be realized only with difficulty can therefore also be used for the current spreading layer. Given a sufficiently good electrical contact between the current spreading layer 31 and the semiconductor body 2, the connection layer can also be dispensed with.

The connection layer 32 is preferably embodied in metallic fashion or based on a metallic alloy. Furthermore, the connection layer is preferably made so thin that radiation generated in the active region can pass through the connection layer at least partly.

The connection layer can contain for example titanium, platinum, nickel, rhodium or some other metal having good contact properties with respect to a semiconductor layer. Alternatively or supplementarily, the connection layer can contain a metallic alloy, preferably comprising at least one of the materials mentioned. Platinum has been found to be particularly advantageous. The thickness of the connection layer is preferably at most 10 nm, for example 3 to 7 nm. By way of example, a platinum layer having a thickness of 6 nm has a transmission of approximately 40% in the blue spectral range.

In a plan view of the semiconductor chip 1, the lateral extent of the injection barrier 5 is at least as large as contact 4. It can thus be ensured that charge carriers injected into the contact 4 during operation of the semiconductor chip 1, on account of the injection barrier, are not injected or are injected only to a very small proportion directly in a vertical direction into the semiconductor body 2. The vast majority of the charge carriers are injected from the contact layer 41 and in a lateral direction into the current spreading layer 31 and pass via the connection layer 32 outside the injection region 5 into the p-conducting semiconductor layer 21 and subsequently into the active region 23. Consequently, below the contact 4 comparatively few charge carriers are injected into the active region 23. In a plan view of the semiconductor chip, in the active region radiation is therefore generated on account of charge carrier recombination predominantly outside the contact 4. The proportion of radiation which is generated in the active region 23 and subsequently absorbed in the contact 4 can thus be reduced.

The mirror layer 42 serves for further reduction of absorption in the contact, in particular in the contact layer 41. The mirror layer is expediently formed by means of a material which has a highest possible reflectivity for radiation generated in the active region. Preferably, the mirror layer is embodied in metallic fashion or based on a metallic alloy. By way of example, gold is suitable in the infrared and red spectral range, and aluminum, silver, palladium and rhodium have a comparatively high reflectivity in the blue, green and ultraviolet spectral range.

Absorption of radiation generated in the active region 23 in the contact layer 41 can therefore be avoided by means of the mirror layer 42. The material for the contact layer 41 can therefore be chosen largely independently of the optical properties with regard to good external contact-connectability of the semiconductor chip, for instance by means of a bonding wire. In particular a metal, for instance gold, or a metallic alloy containing gold, for example, for instance AuSn, is suitable as material.

A further contact 45 is arranged on that side of the carrier 20 which is remote from the semiconductor body 2. By applying an external electrical voltage between the contact 4 and the further contact 45, charge carriers can be injected into the active region and can recombine there with emission and radiation.

The semiconductor body 2, in particular the active region 23, preferably contains a III-V semiconductor material. III-V semiconductor materials are particularly suitable for generating radiation in the ultraviolet ($In_xGa_yAl_{1-x-y}N$) through visible ($In_x$, $Ga_yAl_{1-x-y}N$, in particular for blue to green radiation, or $In_xGa_yAl_{1-x-y}P$, in particular for yellow to red radiation) to the infrared ($In_xGa_yAl_{1-x-y}As$) spectral range. Here $0 \leq x \leq 1$, $0 \leq y \leq 1$ and $x+y \leq 1$ in each case hold true, in particular where $x \neq 1$, $y \neq 1$, $x \neq 0$ and/or $y \neq 0$. With III-V semiconductor materials, in particular from the material systems mentioned, high internal quantum efficiencies can furthermore be obtained in the generation of radiation.

A protective layer 7 is arranged on the semiconductor body 2, and covers the semiconductor body preferably also at the side areas thereof. Said protective layer serves to protect the semiconductor body against harmful external environmental influences, for instance moisture. However, such a protective layer is not absolutely necessary. The protective layer is expediently formed in dielectric fashion and preferably contains an oxide, for instance silicon oxide, a nitride, for instance silicon nitride, or an oxynitride, for instance silicon oxynitride.

The doping of the semiconductor layers is specified merely by way of example in the exemplary embodiment. In particular, the conduction types of the semiconductor layers can be inverted in a departure therefrom, such that the semiconductor layers described as n-doped are p-doped and the semiconductor layers described as p-doped are n-doped.

The semiconductor chip 1 is embodied as an LED semiconductor chip and provided for generating incoherent radiation. In a departure therefrom, the semiconductor chip can also be embodied as an RCLED semiconductor chip. In such a semiconductor chip, the active region is arranged in a cavity. As an alternative, the semiconductor chip can also be embodied for generating coherent radiation. In particular, the semiconductor chip can be embodied as surface emitting semiconductor laser chip (VCSEL) or as a surface emitting semiconductor chip for operation in an external resonator (VECSEL).

Figure 2:
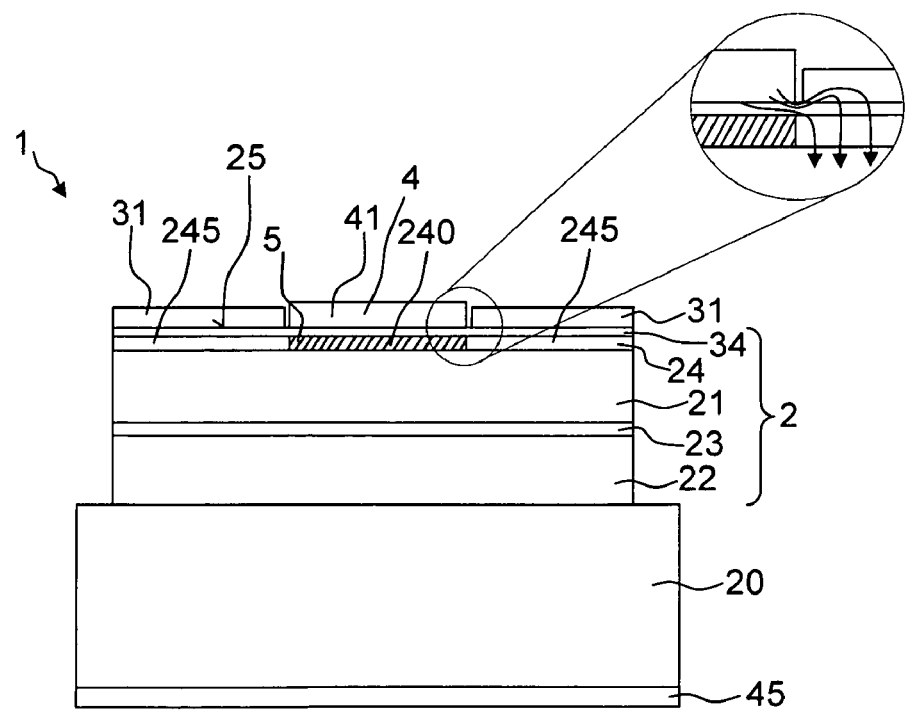
FIG. 2 shows a second exemplary embodiment of a semiconductor chip according to the invention in schematic sectional view.

A second exemplary embodiment of a semiconductor chip according to the invention is illustrated schematically in FIG. 2. The second exemplary embodiment substantially corresponds to the first exemplary embodiment described in connection with FIG. 1. In contrast to the first exemplary embodiment, the semiconductor body 2 additionally has a tunnel contact layer 34 and a further tunnel contact layer 24. The tunnel contact layer and the further tunnel contact layer each have a high charge carrier concentration, preferably at least $10^{18}$ cm$^{-3}$, particularly preferably at least $10^{19}$ cm$^{-3}$.

Furthermore, the tunnel contact layer 34 and the further tunnel contact layer 24 are doped with mutually opposite signs. In this case, the tunnel contact layer 34 has a different conduction type than the semiconductor layer 21 arranged between the active region 23 and the tunnel contact layer. For the case described by way of example where the semiconductor layer 21 is doped in p-conducting fashion, therefore, the tunnel contact layer 34 is doped in n-conducting fashion. Correspondingly, the further tunnel contact layer 24, in the same way as the semiconductor layer 21 adjoining it, is doped in p-conducting fashion, wherein the further tunnel contact layer 24 has a higher doping concentration than the semiconductor layer 21.

A current spreading layer 31 is formed on that side of the tunnel contact layer which is remote from the active region 23. An injection of charge carriers from the current spreading layer 31 into the semiconductor body 2 is simplified by means of the tunnel contact layer 34 and the further tunnel contact layer 24. In contrast to the first exemplary embodiment described in connection with FIG. 1, therefore, semiconductor layers fulfill the function of a connection layer. An additional connection layer arranged between the semiconductor body 2 and the current spreading layer 31 can thus be dispensed with.

Furthermore, in contrast to the first exemplary embodiment, the injection barrier 5 is formed in the semiconductor body 2. The injection barrier 5 is a region 240 of the further tunnel contact layer 24. In this region, the further tunnel contact layer 24 has a lower electrical conductivity than in a laterally adjacent region 245 of the further tunnel contact layer 24. In a plan view of the semiconductor chip 1, the contact 4 runs in a lateral direction congruently or at least substantially congruently with the injection barrier 5, that is to say the region 240 of the further tunnel contact layer 24. By means of an injection barrier, the shaping of which is adapted to that of the contact, an injection of charge carriers into the active region below the contact 4 can be reduced particularly efficiently.

The tunnel contact layer 34 is arranged between the injection barrier 5 and the contact 4. The contact 4 and the injection barrier 5, that is to say the region of reduced electrical conductivity 240, are therefore spaced apart from one another in a vertical direction. During operation of the semiconductor chip 1, charge carriers can be injected in a vertical direction from the contact 4 into the tunnel contact layer 34. However, a charge carrier flow running further vertically in a direction of the active region is avoided or at least greatly reduced by means of the injection barrier.

Possible injection paths of charge carriers are illustrated schematically on the basis of arrows in an enlarged excerpt in FIG. 2. Charge carriers can pass from the contact 4 via the tunnel contact layer 34 into the current spreading layer 31 arranged outside the semiconductor body. In said current spreading layer, the current can spread out in a lateral direction and subsequently be injected via the tunnel contact layer 34 into the semiconductor body 2. In this way, a large-area injection of charge carriers can be obtained by means of the current spreading layer 31 even for the case where the tunnel contact layer 34 has a comparatively low transverse conductivity. The tunnel contact layer 34 can therefore be made very thin, for instance with a thickness of 100 nm or less, preferably 20 nm or less, particularly preferably 10 nm or less.

Furthermore, in contrast to the first exemplary embodiment described in connection with FIG. 1, the contact 4, in particular the contact layer 41, is spaced apart from the current spreading layer 31 in a lateral direction. Therefore, the contact and the current spreading layer are electrically conductively connected to one another via the tunnel contact layer 34 rather than directly. In contrast to the first exemplary embodiment, therefore, the injection of charge carriers into the semiconductor body is effected in the region of the interface 25 of the semiconductor body 2 in which the contact 4, in particular the contact layer 41, adjoins the semiconductor body. In this case, the contact 4 is preferably formed with regard to a low contact resistance with respect to the semiconductor body 2.

The semiconductor chip illustrated in FIG. 2 furthermore has no protective layer. However, such a protective layer can likewise be provided and embodied in particular as described in the first exemplary embodiment.

Figure 3:
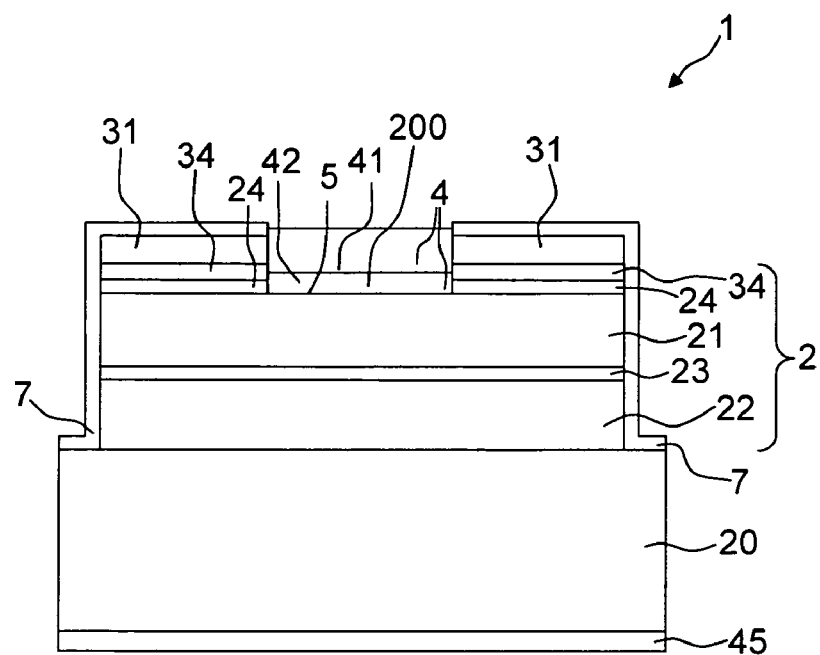
FIG. 3 shows a third exemplary embodiment of a semiconductor chip according to the invention in schematic sectional view.

A third exemplary embodiment of a semiconductor chip according to the invention is illustrated in schematic sectional view in FIG. 3. The third exemplary embodiment substantially corresponds to the first exemplary embodiment described in connection with FIG. 1. In contrast thereto, the semiconductor body 2, as described in connection with FIG. 2, has a tunnel contact layer 34 and a further tunnel contact layer 24.

Furthermore, the semiconductor body 2 has a recess 200. The contact 4 is arranged in the recess 200. The p-conducting semiconductor layer 21 is uncovered by means of the cutout. The tunnel contact layer 34 and the further tunnel contact layer 24 are therefore removed in the region of the contact 4. Since the p-conducting semiconductor layer 21 has a lower doping concentration than the tunnel contact layers 24, 34, a high potential barrier, in particular a Schottky barrier, between the contact 4, in particular between the mirror layer 42, and the semiconductor body, in particular the p-conducting semiconductor layer 21, can be formed in a simplified manner. A direct vertical injection from the contact 4 into the active region 23 can thus be reduced.

As described in connection with FIG. 2, the tunnel contact layer 34 and the further tunnel contact layer 24 fulfill in particular the function of the connection layer 32 of the first exemplary embodiment described in connection with FIG. 1. A connection layer which is arranged on the semiconductor body 2 and is situated between the current spreading layer 31 and the semiconductor body is accordingly not provided.

During operation of the semiconductor chip 1, charge carriers are injected into the contact layer 41. From there the charge carriers pass in a lateral direction into the current spreading layer 31, which directly adjoins the contact layer in a lateral direction. From the current spreading layer, the charge carriers are injected in a vertical direction into the semiconductor body 2 and thus pass into the active region 23, wherein an injection into the active region below the contact is once again reduced.

Figure 4:
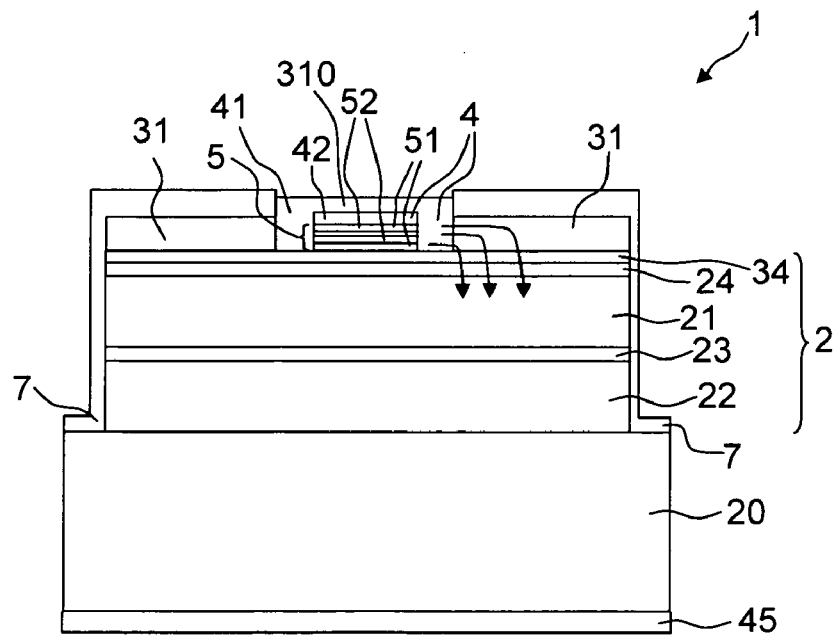
FIG. 4 shows a fourth exemplary embodiment of a semiconductor chip according to the invention in schematic sectional view.

A fourth exemplary embodiment of a semiconductor chip according to the invention is illustrated in a schematic sectional view in FIG. 4. This fourth exemplary embodiment substantially corresponds to the first exemplary embodiment described in connection with FIG. 1. In contrast to the first exemplary embodiment, the semiconductor body 2 has a tunnel contact layer 34 and a further tunnel contact layer 24. The tunnel contact layer 34 and the further tunnel contact layer 24 extend over the p-conducting semiconductor layer 21 over the whole area.

In the fourth exemplary embodiment, the injection barrier 5 is formed by means of a plurality of insulation layers 51, 52 arranged on the semiconductor body. The injection barrier is therefore arranged outside the semiconductor body 2 and is situated at least in regions between the contact 4 and the semiconductor body 2. An injection of charge carriers from the contact 4 into a region of the semiconductor body which adjoins the insulation layer can be avoided in a simple manner by means of the insulation layers.

The insulation layers 51 and 52 each form a layer pair, wherein the layers have mutually different refractive indices. A dielectric mirror in the form of a Bragg mirror is formed by means of said layer pairs. Radiation which is generated in the active region 23 during operation of the semiconductor chip 1 and is emitted in a direction of the contact 4 and impinges on the dielectric layers 51, 52 can thus be reflected back into the semiconductor body with a comparatively high reflectivity, preferably of at least 80%, particularly preferably at least 90%. Said radiation can subsequently emerge from the semiconductor chip 1. The coupling-out efficiency of the semiconductor chip can thus be increased. The higher the number of layer pairs, the higher the reflectivity of the Bragg mirror can be. The injection barrier can therefore simultaneously fulfill the function of a highly efficient mirror. On the other hand, as the number of insulation layers increases so does the deposition duration. In particular with regard to a short deposition duration, therefore, in a departure from the exemplary embodiment shown, just one individual insulation layer may be formed between the semiconductor body 2 and the contact 4.

The contact 4 once again has a contact layer 41 and a mirror layer 42. The mirror layer 42 covers the insulation layers 51, 52. Radiation which is generated in the active region 23 of the semiconductor chip 1 and transmitted through the Bragg mirror formed by means of the insulation layers 51, 52 can thus be reflected back from the mirror layer 42 into the semiconductor body 2. A mirror having a particularly high total reflectivity can be formed by means of the mirror layer arranged on the Bragg mirror on the side remote from the semiconductor body. In particular, radiation portions which are transmitted by the Bragg mirror can be reflected back into the semiconductor body by the mirror layer and subsequently emerge from the semiconductor chip 1.

Furthermore, in contrast to the exemplary embodiment shown in FIG. 1, the contact layer 41 has a larger extent in a lateral direction than the mirror layer 42. The contact layer 41 can therefore mold over the mirror layer 42, in particular completely. In a lateral direction, the contact layer 41 therefore runs between the current spreading layer 31 and the injection barrier 5, that is to say the insulation layers 51, 52. Furthermore, the contact layer runs in a lateral direction between the mirror layer 42 and the current spreading layer 31. Charge carriers can thus pass from the contact layer directly into the current spreading layer in a simplified manner. Possible current paths are once again illustrated by means of arrows in FIG. 4.

In this case, the mirror layer 42 can be formed independently of the electrical contact properties in particular with regard to a best possible reflective coating of the Bragg mirror—formed by means of the insulation layers 51, 52—on that side of said mirror which is remote from the semiconductor body.

Figure 5:
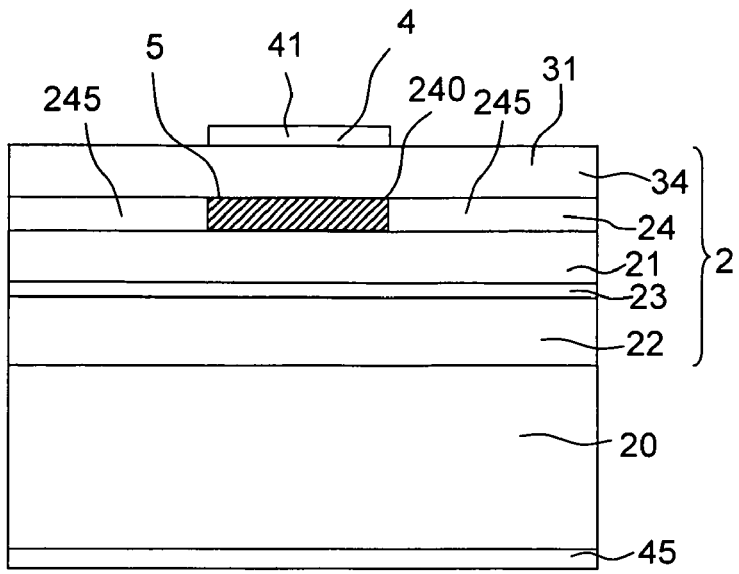
FIG. 5 shows a fifth exemplary embodiment of a semiconductor chip according to the invention in schematic sectional view.

A fifth exemplary embodiment of a semiconductor chip according to the invention is shown on the basis of a schematic sectional view in FIG. 5. In contrast to the previous exemplary embodiments, the current spreading layer 31 is integrated into the semiconductor body 2. In this case, the current spreading layer 31 is formed by means of a tunnel contact layer 34. The contact 4 is arranged on that side of the tunnel contact layer which is remote from the active region 23. The injection barrier 5 is formed by means of a region 240 of the tunnel contact layer 24 as described in connection with FIG. 2. In this region, the electrical conductivity of the further tunnel contact layer 24 is lower than outside this region, that is to say in a laterally adjacent region 245. In this exemplary embodiment, the tunnel contact layer 34 is thick enough to have a sufficiently high transverse conductivity. A large-area injection of charge carriers outside the injection barrier 5 into the active region 23 is thus simplified. A current spreading layer arranged outside the semiconductor body can be dispensed with in this case.

In this exemplary embodiment, the contact 4 preferably has a lowest possible, in particular ohmic, contact resistance with respect to the semiconductor body 2. For this purpose, the contact layer 41 can also be formed in multilayered fashion. By way of example, a layer sequence of titanium, platinum and gold is suitable for the contact layer as seen from the semiconductor body. During operation of the semiconductor chip, charge carriers are injected from the contact firstly in a vertical direction into the semiconductor body 2, in particular into the current spreading layer. A further-reaching vertical injection into the active region is reduced by means of the region 240 of reduced electrical conductivity.

The contact 4 is arranged on the current spreading layer 31. In this exemplary embodiment, the current spreading layer is unpatterned in a lateral direction. The production of the semiconductor chip is thus simplified. In a departure therefrom, however, a recess can be provided in the current spreading layer, the contact being arranged in said recess.

Figure 6A:
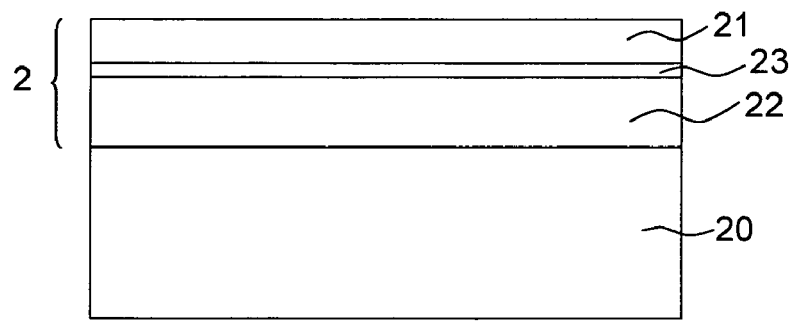
FIGS. 6A to 6E show a first exemplary embodiment of a production method according to the invention on the basis of some intermediate steps in schematic sectional view.

A first exemplary embodiment of a method according to the invention for producing a semiconductor chip is shown on the basis of schematically illustrated intermediate steps in sectional view in FIGS. 6A to 6E. As illustrated in FIG. 6A, a semiconductor body 2 having a semiconductor layer sequence is provided. The semiconductor layer sequence, which forms the semiconductor body 2, is preferably deposited epitaxially, for instance by means of MOVPE and MBE, on a carrier 20, which serves as a growth substrate.

Figure 6B:
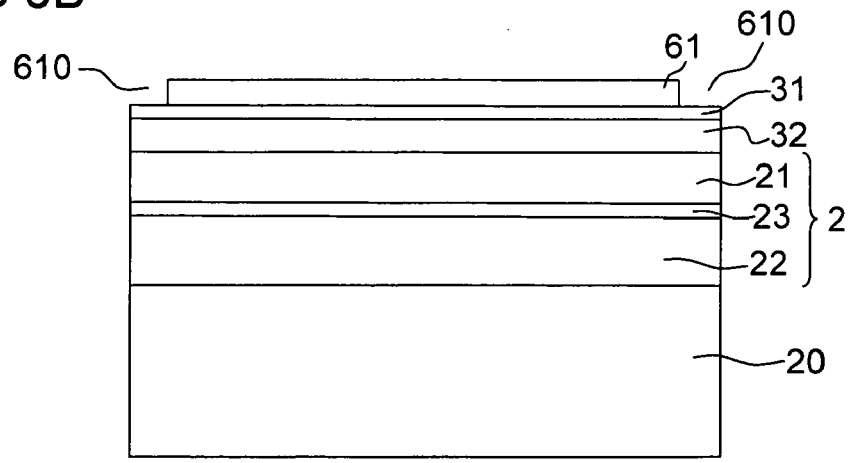

Afterward, as illustrated in FIG. 6B, a connection layer 32 and a current spreading layer 31 are deposited on the semiconductor body. This is preferably done in each case by means of vapor deposition or sputtering. In this case, the connection layer is deposited first and then the current spreading layer 31.

A masking layer 61 having a lateral patterning is formed on the current spreading layer. The current spreading layer 31 is uncovered in a cutout 610 of the masking layer 61. The masking layer is preferably patterned by means of a lithography process. In this case, the masking layer is preferably a photosensitive layer, for instance a photosensitive resist layer.

Figure 6C:
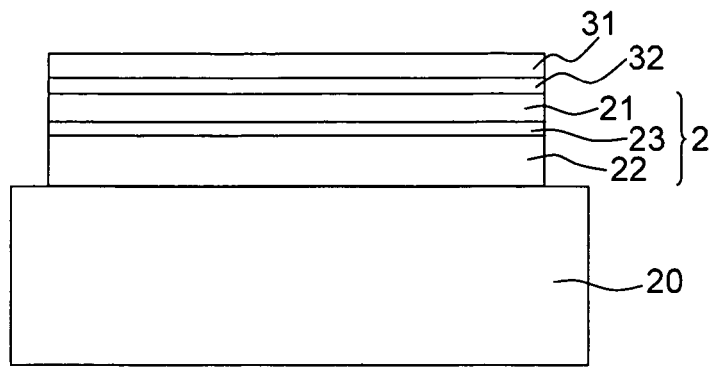

As illustrated in FIG. 6C, material of the current spreading layer, of the connection layer 32 and of the semiconductor body 2 which is situated below the cutout 610 of the masking layer 61 is removed. The current spreading layer and the semiconductor body are therefore patterned by means of a common masking layer 61 in a lateral direction. After the lateral patterning of the current spreading layer 31, of the connection layer 32 and of the semiconductor body 2, the masking layer can be removed. The lateral structure of the masking layer 61 is transferred to the current spreading layer 31, the connection layer 32 and the semiconductor body 2 preferably in a chemical process, in particular in a wet-chemical etching process or a dry-chemical etching process, for instance reactive ion etching or backsputtering.

Optionally, a protective layer 7 can then be applied on the semiconductor body, for instance by means of sputtering or vapor deposition.

A further masking layer 62 is applied on the current spreading layer 31, or if appropriate on the protective layer 7. Said further masking layer 62 is once again patterned laterally and has a cutout 620. The lateral structure of the further masking layer 62 is subsequently transferred to the current spreading layer 31 and, if appropriate, to the protective layer 7. Thus, a recess 310 is formed in the current spreading layer. This is preferably once again effected in a wet-chemical or dry-chemical etching step.

Figure 6D:
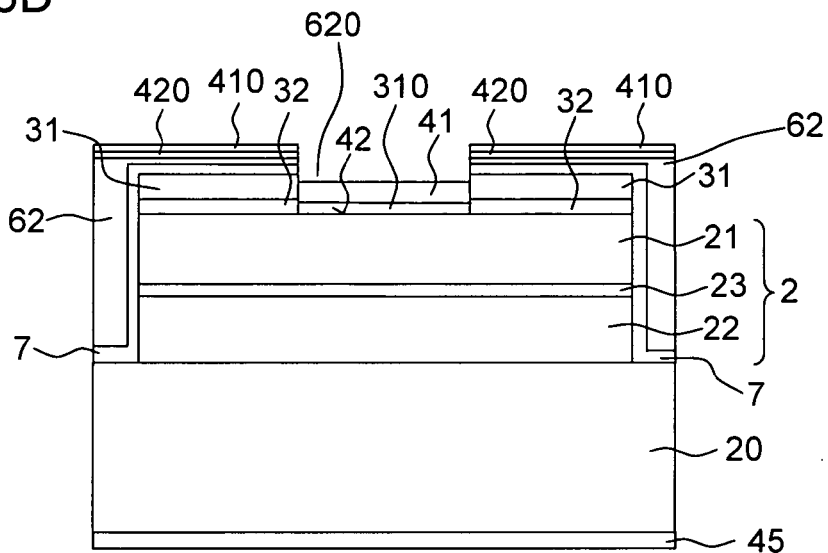

In a further step, as illustrated in FIG. 6D, material for the mirror layer 42 and subsequently material for the contact layer 41 are deposited on the semiconductor body 2. The mirror layer 42 and the contact layer 41 are preferably deposited by means of vapor deposition or sputtering.

Material 420 for the mirror layer 42 which was applied outside the cutout 620 on the further masking layer 62 is lifted off together with the further masking layer 62 from the semiconductor body. Material 410 for the contact layer 41 which was applied outside the cutout 620 on the masking layer 62 is likewise removed in this case.

Figure 6E:
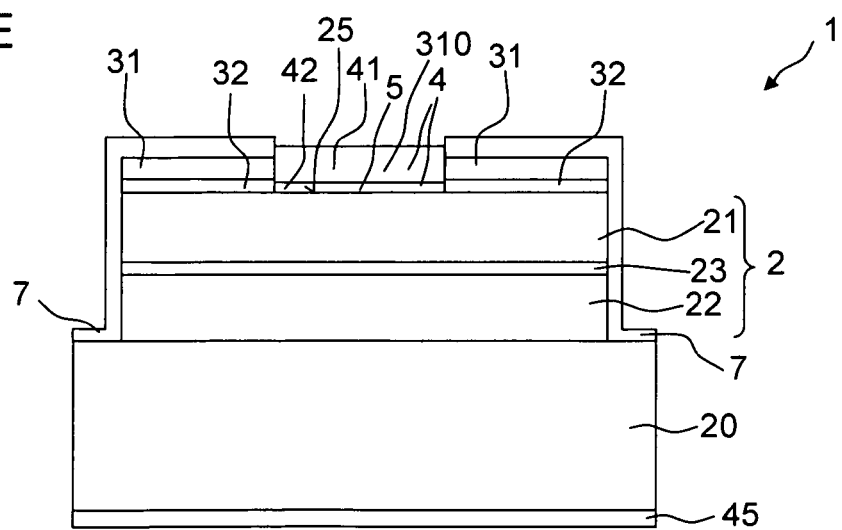

In order to complete the semiconductor chip 1, as illustrated in FIG. 6E, a further contact 45 is formed on that side of the carrier 20 which is remote from the semiconductor body 2. The further contact 45 preferably contains a metal, for instance gold, silver, nickel, titanium or platinum, or a metallic alloy comprising at least one of said metals. The further contact layer is preferably deposited by means of vapor deposition or sputtering.

In the case of an electrically nonconductive growth substrate, the latter can be removed in regions, for example, such that contact can be made with the semiconductor body by means of the further contact 45 in a region in which the semiconductor body 2 is uncovered.

As an alternative, the growth substrate can also be completely removed or at least thinned. The carrier 20 can then be different from the growth substrate. A semiconductor chip in which the growth substrate is removed or thinned is also referred to as a thin-film semiconductor chip.

In the context of the present invention, a thin-film semiconductor chip, for instance a thin-film light emitting diode chip, can furthermore be distinguished by at least one of the following characteristic features:
- at a first main area—facing toward a carrier element, e.g. the carrier 20, —of a semiconductor body comprising a semiconductor layer sequence having an active region, in particular an epitaxial layer sequence, a mirror layer is applied or formed, for instance in a manner integrated as a Bragg mirror in the semiconductor layer sequence, said layer reflecting at least part of the radiation generated in the semiconductor layer sequence back into the latter;
- the semiconductor layer sequence has a thickness in the region of 20 µm or less, in particular in the region of 10 µm; and/or
- the semiconductor layer sequence contains at least one semiconductor layer with at least one area which has an intermixing structure which ideally leads to an approximately ergodic distribution of the light in the semiconductor layer sequence, that is to say that it has an as far as possible ergodically stochastic scattering behavior.

A basic principle of a thin-film light emitting diode chip is described for example in I. Schnitzer et al., Appl. Phys. Lett. 63 (16), Oct. 18, 1993, 2174-2176, the disclosure content of which in this respect is hereby incorporated by reference in the present application.

Figure 7A:
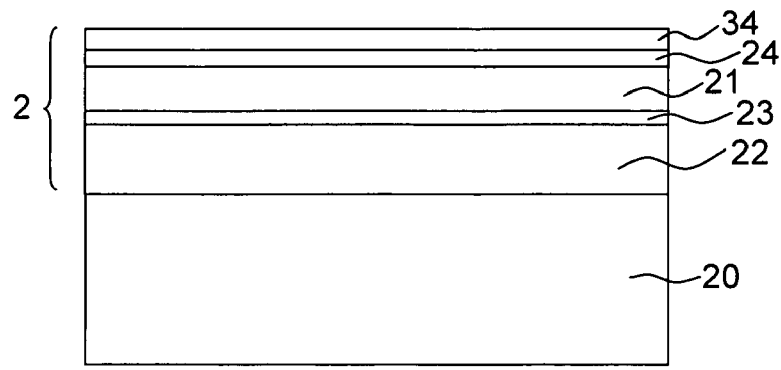
FIGS. 7A to 7E show a second exemplary embodiment of a production method according to the invention on the basis of some intermediate steps in schematic sectional view.
Figure 7B:
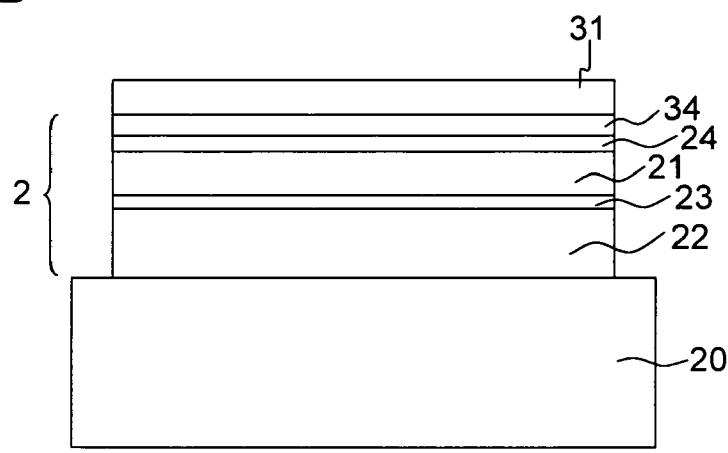

A second exemplary embodiment of a method according to the invention is illustrated schematically in FIGS. 7A to 7E. As shown in FIG. 7A, a semiconductor body 2 having a semiconductor layer sequence is provided. The semiconductor layer sequence of the semiconductor body 2 has a tunnel contact layer 34 and a further tunnel contact layer 24 as described in connection with FIG. 4.

A current spreading layer 31 is applied on the semiconductor body 2. Said current spreading layer 31 and the semiconductor body 2 are then patterned laterally as described in connection with FIGS. 6B and 6C. In this case, this lateral patterning can once again be effected by means of a masking layer, which is not explicitly illustrated in FIG. 7B.

Figure 7C:
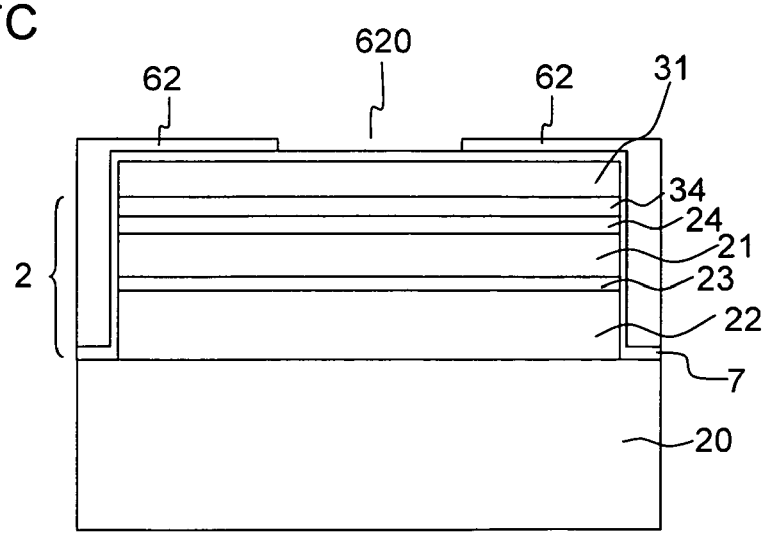

The semiconductor body 2 is thereupon covered completely with the protective layer 7 (FIG. 7C). The protective layer 7 can be deposited for example by means of vapor deposition or sputtering.

As described in connection with FIG. 6B, a further masking layer 62 having a cutout 620 is formed. That region of the current spreading layer 31 which is uncovered below the cutout 620 is removed. In a departure from FIG. 7D, however, the current spreading layer 31 can also have just a cutout which does not extend completely through the current spreading layer in a vertical direction.

On the semiconductor body 2, an alternate sequence of insulation layers 51 and 52 is then deposited onto the semiconductor body. The insulation layers are preferably deposited by means of sputtering or vapor deposition. In this case, as specified in connection with FIG. 4, the insulation layer 51 and the further insulation layer 52 produce a layer pair having layers having different refractive indices. A dielectric mirror is formed by the plurality of layer pairs. In a subsequent step, a mirror layer 42 is deposited on the insulation layers 51, 52.

The deposition of the insulation layers 51, 52 and of the mirror layer 42 is preferably effected in such a way that said layers are spaced apart from the current spreading layer 31 in a lateral direction. For this purpose, by way of example, the recess 310 in the current spreading layer 31 can be formed by means of wet-chemical etching. By virtue of the resultant undercut, the recess 310 of the current spreading layer 31 can have a larger lateral extent than the cutout 620 of the further masking layer 62.

For example by depositing the insulation layers 51, 52 and the mirror layer 42 from a perpendicular or substantially perpendicular direction, an interspace can thus arise between these layers and the current spreading layer.

A contact layer 41 is subsequently deposited, which contact layer fills, preferably completely, said interspace. For this purpose, the deposition of the contact layer 41 is preferably effected not from a perpendicular direction but rather from an oblique direction with respect to the semiconductor body upon simultaneous rotation of the semiconductor body. In this way, the contact layer 41 can completely mold over the mirror layer 42 and the insulation layers 51, 52 in a lateral direction.

Figure 7D:
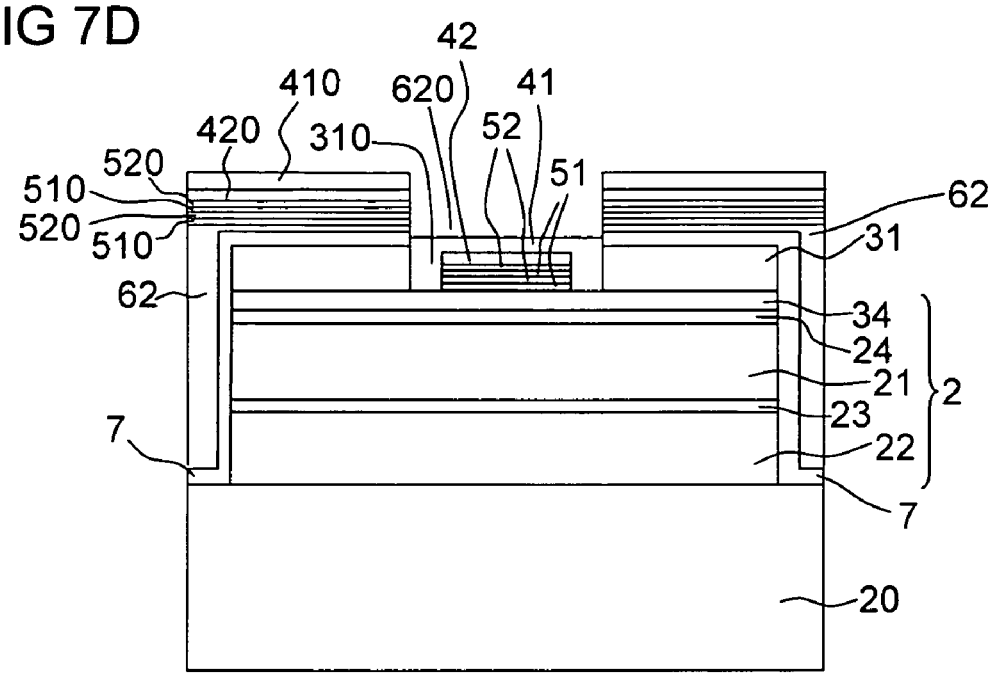
Figure 7E:
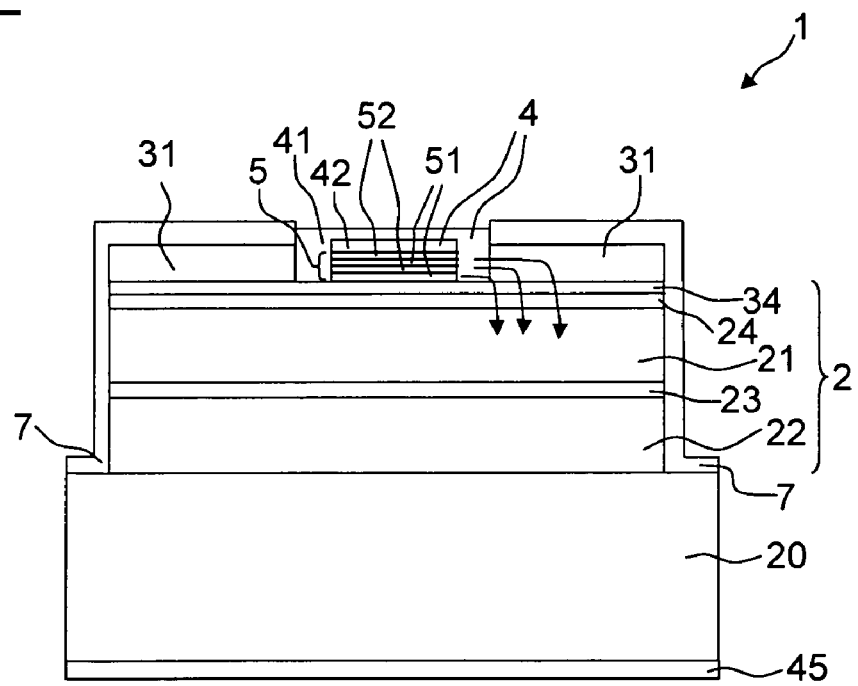

In a departure from FIG. 7D, the material for the contact layer 41 can also be deposited in a separate process after the further masking layer 62 together with the material situated thereon has already been removed. In this case, the laterally patterned formation of the contact layer 41 can be effected by means of a third masking layer, which is not explicitly illustrated in the figures. Said third masking layer is preferably formed and patterned laterally before the contact layer is deposited on the semiconductor body 2. In this case, the third masking layer can have a cutout which is larger than the cutout 620 of the further masking layer 62.

Figure 8A:
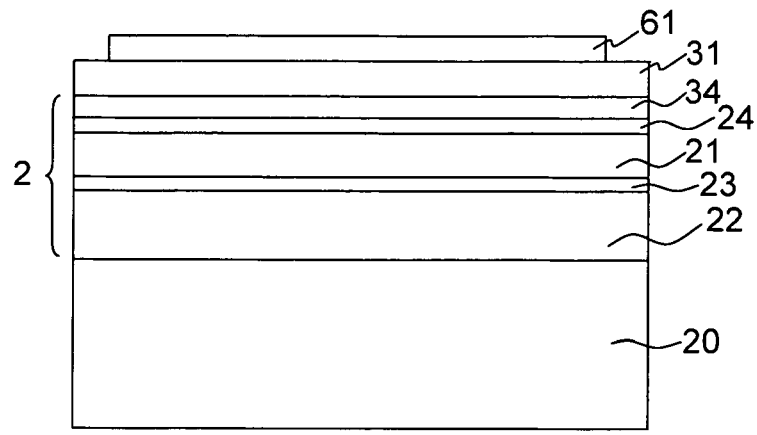
FIGS. 8A to 8E show a third exemplary embodiment of a production method according to the invention on the basis of some intermediate steps in schematic sectional view.
Figure 8B:
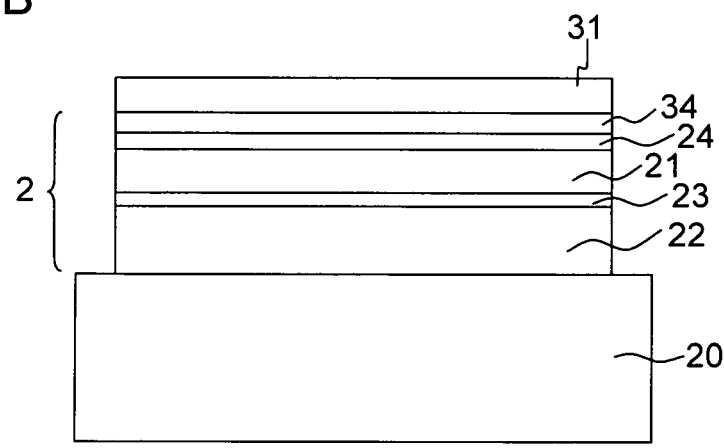
Figure 8C:
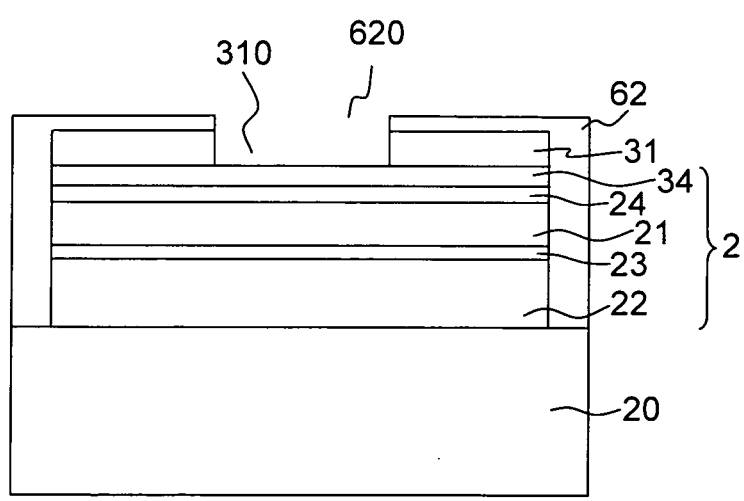
Figure 8D:
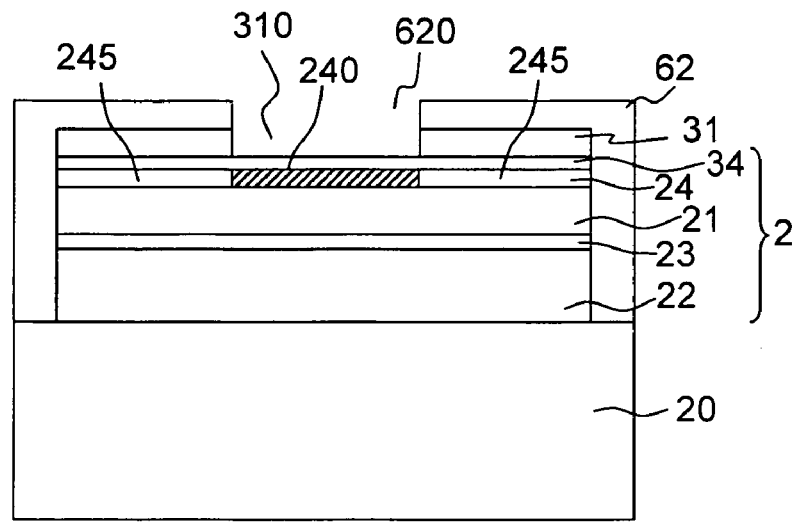

A third exemplary embodiment of a method according to the invention is shown on the basis of schematically illustrated intermediate steps in sectional view in FIGS. 8A to 8E. The semiconductor body 2 and the current spreading layer 31 formed on the semiconductor body are embodied as described in connection with FIG. 7A. FIG. 8B accordingly corresponds to FIG. 7B.

FIG. 8A explicitly shows an intermediate step in which a masking layer 61 (not illustrated in FIGS. 7A and 7B) is situated on the current spreading layer 31. As described in connection with FIG. 6D, a further masking layer 62 having a cutout 620 is formed on the current spreading layer 31. The lateral structure of the masking layer 62 is subsequently transferred into the current spreading layer 31, such that a recess 310 is formed in the current spreading layer 31 below the cutout 620 of the further masking layer 62.

The injection barrier 5 is formed by virtue of the fact that in a region 240 of the further tunnel contact layer 24, the electrical conductivity of this layer is locally reduced.

A plasma method, for example, which can electrically deactivate acceptors, for instance Mg, or donors, for instance Si, is suitable for this purpose. By way of example, by means of a hydrogen plasma, hydrogen can be introduced through the cutout 620 of the further masking layer 62 into the further tunnel contact layer 24. It is thereby possible to electrically deactivate acceptors in the further tunnel contact layer, for instance Mg acceptors in an $In_xAl_yGa_{1-x-y}N$ semiconductor layer where $0 \leq x \leq 1$ and $0 \leq y \leq 1$. A plasma method is particularly suitable if the region in which the electrical conductivity is to be reduced is at a small distance, preferably 100 nm or less, particularly preferably 10 nm or less, from the interface 25 of the semiconductor body 2.

Particularly in the case of larger distances between the region 240 and the interface 25 of the semiconductor body 2, the conductivity can also be locally reduced by means of implanting ions through the cutout 620 of the further masking layer 62. As an alternative, the crystal structure can be disturbed locally in a targeted manner. Backsputtering, for example, for instance by means of an Ar ion beam, is suitable for this purpose. Particularly in the case of backsputtering, material of the semiconductor body 2 can also be removed in this case.

Figure 8E:
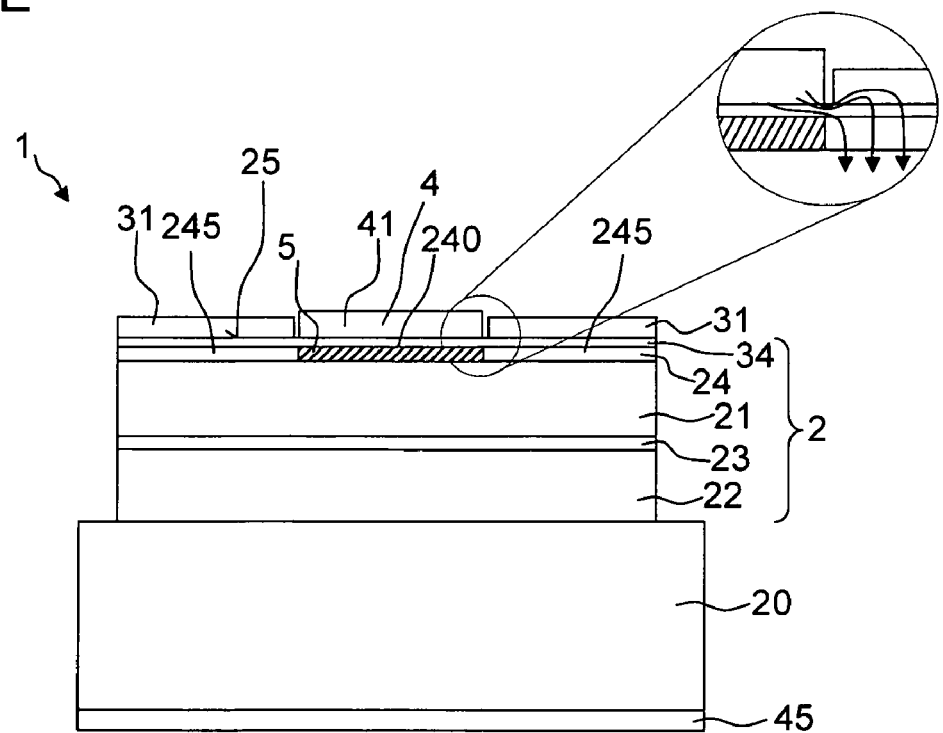

A completed semiconductor chip 1 embodied as described in connection with FIG. 2 is illustrated in FIG. 8E. This semiconductor chip has a further contact 45, which can be formed as described in connection with FIG. 6E.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. A semiconductor chip, comprising:
   a semiconductor body having a semiconductor layer sequence that includes an active region provided for generating radiation;
   a contact arranged on the semiconductor body;
   an injection barrier formed between the contact and the active region;
   a current spreading layer, which is electrically conductively connected to the contact and which is provided for injecting charge carriers into the active region during operation of the semiconductor chip in a lateral direction outside the injection barrier; and
   a connection layer containing a metal or a metallic alloy arranged between the current spreading layer and the semiconductor body.

2. The semiconductor chip as claimed in claim 1, wherein the lateral shaping of the injection barrier is adapted to a lateral shaping of the contact.

3. The semiconductor chip as claimed in claim 1, wherein the injection barrier is formed at an interface between the contact and the semiconductor body.

4. The semiconductor chip as claimed in claim 3, wherein the injection barrier is formed by a potential barrier between the contact and the semiconductor body.

5. The semiconductor chip as claimed in claim 1, wherein the injection barrier is formed in the semiconductor body.

6. The semiconductor chip as claimed in claim 5, wherein the injection barrier is formed by a region in which an electrical conductivity of a semiconductor layer arranged between the active region and the contact is locally reduced.

7. The semiconductor chip as claimed in claim 6, wherein the region of locally reduced conductivity is spaced apart from the contact in a vertical direction.

8. The semiconductor chip as claimed in claim 1, wherein the injection barrier is formed outside the semiconductor body.

9. The semiconductor chip as claimed in claim 8, wherein the injection barrier is formed by an insulation layer arranged between the semiconductor body and the contact.

10. The semiconductor chip as claimed in claim 9, wherein a dielectric mirror is formed by the insulation layer.

11. The semiconductor chip as claimed in claim 1, wherein the contact has a contact layer, which terminates the contact on a side remote from the semiconductor body.

12. The semiconductor chip as claimed in claim 11, wherein the contact has a mirror layer arranged between the contact layer and the semiconductor body.

13. The semiconductor chip as claimed in claim 12, wherein the contact layer projects beyond the mirror layer at least in regions in a lateral direction.

14. The semiconductor chip as claimed in claim 1, wherein the current spreading layer has a recess, in which the contact is arranged.

15. The semiconductor chip as claimed in claim 1, wherein the current spreading layer and the contact adjoin one another at least in some regions thereof.

16. The semiconductor chip as claimed in claim 1, wherein the current spreading layer and the contact are spaced apart from one another laterally.

17. The semiconductor chip as claimed in claim 1, wherein the current spreading layer is nonmetallic and transmissive to radiation generated in the active region.

18. The semiconductor chip as claimed in claim 1, wherein the current spreading layer contains a transparent conductive oxide material.

19. The semiconductor chip as claimed in claim 1, wherein the connection layer has a thickness of at most 10 nm.

20. The semiconductor chip as claimed in claim 1, wherein the current spreading layer is a semiconductor layer, which is different with regard to its conduction type than a further semiconductor layer arranged between the current spreading layer and the active region.

21. The semiconductor chip as claimed in claim 20, wherein the current spreading layer is formed as a tunnel contact layer and a further tunnel contact layer is arranged on that side of the tunnel contact layer which faces the active region, and wherein the further tunnel contact layer has a different conduction type than the tunnel contact layer.

22. The semiconductor chip as claimed in claim 21, wherein the injection barrier is formed by a region of the further tunnel contact layer in which the electrical conductivity is locally reduced.

23. The semiconductor chip as claimed in claim 1, wherein the semiconductor chip comprises an LED semiconductor chip, an RCLED semiconductor chip or a surface emitting semiconductor laser chip.

24. A semiconductor chip, comprising:
   a semiconductor body having a semiconductor layer sequence that includes an active region provided for generating radiation;
   a contact arranged on the semiconductor body;
   an injection barrier formed between the contact and the active region;
   a current spreading layer, which is electrically conductively connected to the contact and which is provided for injecting charge carriers into the active region during operation of the semiconductor chip in a lateral direction outside the injection barrier; and
   a tunnel contact layer arranged between the current spreading layer and the active region;
   wherein the tunnel contact layer is different with regard to its conduction type than a further semiconductor layer arranged between the tunnel contact layer and the active region.

25. The semiconductor chip as claimed in claim 24, wherein a further tunnel contact layer is arranged on that side of the tunnel contact layer which faces the active region, wherein the further tunnel contact layer has a different conduction type than the tunnel contact layer.

26. The semiconductor chip as claimed in claim 25, wherein the injection barrier is formed by a region of the further tunnel contact layer in which the electrical conductivity is locally reduced.

27. The semiconductor chip as claimed in claim 24, wherein a lateral shaping of the injection barrier is adapted to a lateral shaping of the contact.

28. The semiconductor chip as claimed in claim 24, wherein the injection barrier is formed by a potential barrier between the contact and the semiconductor body.

29. The semiconductor chip as claimed in claim 24, wherein the injection barrier is formed in the semiconductor body.

30. The semiconductor chip as claimed in claim 24, wherein the injection barrier is formed by an insulation layer arranged between the semiconductor body and the contact.

31. The semiconductor chip as claimed in claim 30, wherein a dielectric mirror is formed by the insulation layer.

32. The semiconductor chip as claimed in claim 24, wherein the current spreading layer has a recess, in which the contact is arranged.

33. The semiconductor chip as claimed in claim 24, wherein the current spreading layer contains a transparent conductive oxide material.

* * * * *

UNITED STATES PATENT AND TRADEMARK OFFICE
CERTIFICATE OF CORRECTION

| | | |
|---|---|---|
| PATENT NO. | : 7,994,519 B2 | Page 1 of 1 |
| APPLICATION NO. | : 12/218492 | |
| DATED | : August 9, 2011 | |
| INVENTOR(S) | : Michael Fehrer | |

It is certified that error appears in the above-identified patent and that said Letters Patent is hereby corrected as shown below:

Title page, item (56) References Cited should read as follows:

--Foreign Patent Documents

DE [[10 20025 008 056 A1]] <u>DE 10 2005 008 056 A1</u> 7/2006--

--Other Publications

Schnitzer et al., "[[303%]] <u>30%</u> external quantum ~~efficiecy~~ <u>efficiency</u> from surface textured, thin-film light emitting diodes", Applied Physics Letters No. 16, Oct. 18, 1993, pp. 2174-2176.--

Signed and Sealed this
Thirtieth Day of October, 2012

David J. Kappos
*Director of the United States Patent and Trademark Office*